Feb. 2, 1971 E. I. SCHWARTZ 3,560,853

SIGNAL GENERATORS HAVING EXTENDED DISPLAYABLE SIGNAL FREQUENCY RANGES

Filed Sept. 26, 1968 2 Sheets-Sheet 1

INVENTOR
Edmund I. Schwartz

INVENTOR
Edmund I. Schwartz

United States Patent Office 3,560,853

Patented Feb. 2, 1971

3,560,853

SIGNAL GENERATORS HAVING EXTENDED DISPLAYABLE SIGNAL FREQUENCY RANGES

Edmund I. Schwartz, Fair Lawn, N.J., assignor to Slant/Fin Corporation, a corporation of New York Filed Sept. 26, 1968, Ser. No. 762,800
Int. Cl. G01r *23/14*
U.S. Cl. 324—79 11 Claims

ABSTRACT OF THE DISCLOSURE

A signal generator capable of being tuned over a wide range of frequencies, has this effective range shifted to a higher range by means of a mixer and a conversion oscillator, for providing a sum frequency at the mixer output equal to that of the signal generator frequency and the conversion oscillator signal frequency. A frequency counting circuit, having a limited input frequency response characteristic, is controlled by selectable timing circuitry, which sequentially applies the generator frequency signal to the counting circuit to cause the counting circuit to provide a code representative of the generator frequency. The timing circuitry then applies the conversion oscillator signal to the counting circuit to cause the counter to accumulate a second code which with the first code represents the sum frequency provided at the mixer output and which frequency exceeds the limited input frequency response of the counting circuit.

This invention relates to signal generators and more particularly to apparatus for extending the useful range of such generators while providing simple and efficient means of displaying the extended range.

Presently, signal generators are available over a wide gamut of frequency ranges. In usual practice a manufacturer or producer of such devices provides a number of different units to cover a spectrum of frequencies, as audio generators to those capable of generating frequencies in the ultra high frequency range or greater.

Basically such generators are capable of being tuned over their given range to provide a plurality of discrete frequencies within the range, as by a continuous tuning procedure or by a frequency synthesis technique. To extend the range of such units, certain manufacturers have provided wideband frequency multiplying devices to be used in conjunction with such generators. An example of such a technique is a wideband frequency doubling network. Such a network or circuit would provide at an output thereof the frequency of the input multiplied by a factor of two. Such doublers have constant attenuation or gain characteristics over the range of operation. Accordingly, one could use such a multiplier to extend the effective range of a signal generator capable of providing frequency signals from 2 to 32 mHz., for example, to 4 to 64 mHz., by coupling the doubler to the output terminal of the generator. However, for higher frequency range extensions with the above generator, one might require a frequency tripler, quadrupler and so on. This, of course, becomes more difficult as wide band, constant gain or attenuation multiplying devices become more difficult to design and implement, and for most instances become impractical for operation over any relatively wide band of frequencies.

However, an advantage of such multiplying techniques, is that, by utilizing the signal generator together with the calibrated dials and setting techniques available therein, the operator only has to multiply the dial settings by the multiplication factor of the doubler, for example (i.e, two (2)) to determine the output of the multiplied signal frequency.

To circumvent the limited range of operation problems, associated with multiplying devices, mixing techniques have been utilized and referred to as up or down conversions. In such techniques the output of the signal generator is applied to one input of a balanced mixer or modulator. Another input to the mixer is derived from a conversion oscillator, which may be crystal controlled and hence a relatively stable source of oscillations. The mixer provides as an output thereof the sum and difference products of the two frequencies. The output of the mixer is then filtered by means of a suitable filter, as a bandpass type, to provide for example, the sum frequency. Hence if one desired to extend the range of the above signal generator operating from 2 to 32 mHz. to a range of 12 to 42 mHz., a conversion oscillator operating at 10 mHz. could be selected and the mixer output would provide the sum products of 12 to 42 mHz. for this example. Certain mixing circuits employ diodes with vacuum tubes or transistors and hence can provide gain and allow wideband operation, in accordance with proper filtering and circuit compensating techniques. Using the conversion technique the operator would add the frequency of the conversion oscillator to the dial reading of the generator to obtain the output frequency. To assure accuracy, the frequency of the conversion oscillator is maintained with great stability and hence such devices use crystal controlled oscillators and so on. For example of suitable and known frequency generation and conversion techniques see the text entitled "Single Sideband Principles and Circuits" by E. W. Pappenfus et al. (1964) McGraw-Hill Book Company, pages 38 to 149, Chapters 7 and 8 entitled Exciters for SSB and Frequency Generation, respectively.

In general whether a multiplying or conversion technique is utilized there is the additional factor, which is of paramount importance, concerning the accuracy of the signal generator itself. For example for either technique as described above, if the signal generator range (i.e., 2 to 32 mHz.) is not calibrated, the output frequency range as extended is not truely known.

Calibration of a signal generator, in any case, is essential to give the operator assurance that he is tuned to the correct frequency. Linearity of frequency variation allows the use of interpolating dials with ability to read frequency more accurately. Accuracy of tuning elements, such as the capacitance of the variable capacitance oscillator and lead screw, core and winding accuracy in the variable inductance oscillator are all essential for good dial calibration and oscillator range tracking.

To alleviate and reduce the problems associated with dial calibration a wideband signal generator might incorporate a controllable digial counter and counter timing circuitry for reading frequency directly.

In any such generator the critical dial calibration problem is substantially eliminated by permitting the operator to visualize the generator output frequency over the entire band. Such generators might employ timed controlled counters, decoders and displays to enable accurate setting and frequency adjustment; without the need for accurate and laborious dial setting and tracking schemes.

However, when employing such generators in conjunction with range extension techniques, the problem of using and displaying frequency by counters operating with associated displays becomes difficult. For example digital counting circuits such as those generally used in the art are limited in their frequency operation, as the vacuum tubes, transistors etc., utilized therein, as forming bistable multivibrators and other counting circuits, cannot respond reliably to certain high frequency rates. This deficiency of such devices is well known and hence may be a detriment to a generator depending upon such devices to provide a display means. Accordingly one desiring to use a digital device or a frequency counter to provide a display with a frequency range extended generator may be handicapped by the response and specifications of the counter itself. If one tried to utilize dividing techniques to reduce the input range to the counter, the same limitations would exist in the dividers as they also would not respond easily to such extended high frequency ranges.

It is therefore an object of the invention to provide improved apparatus for extending the range of a signal generator while providing an accurate display of the output frequency.

A further object is to provide an improved signal generator capable of operating over extended frequency ranges without the need for accurate dial calibration.

Another object is to provide an improved apparatus for extending the range of a signal generator using economical circuit components.

Still a further object is to provide improved apparatus for displaying the output frequency of a converted signal generator without the need of accurate dial calibration or requiring mental calculations by the operator or user thereof.

These and other objects of the present invention are accomplished in one embodiment thereof by coupling the output of a wide range signal generator to the input of a suitable mixer circuit. Another input to the mixer circuit is obtained from a range conversion oscillator. The output of the mixer then contains the sum frequency of the signal generator and the oscillator, which sum is a frequency of higher range. A counter having a limited frequency response is selectively coupled to the oscillator output terminal and the signal generator terminal and is controlled by timing circuitry to count and store the frequency count representative of the signal generator frequency within the counter response. From that accumulated count the counter is caused to count and store the count representative of the range conversion oscillator frequency also within the counter response. Accumulation results in the sum frequency being displayed by appropriate controlled output decoding circuitry and an associated display. The fixed frequency of the conversion oscillator is selected to be within the counting capabilities of the counter circuitry.

For even higher range extensions or conversions of the signal generator frequency, the range extension oscillator frequency is multiplied by any suitable integral factor, implemented by fixed narrow band frequency multipliers. The outputs of the multipliers can be selectively coupled to the oscillator input of the mixer. The wideband mixer thereby provides at an output thereof the corresponding sum frequencies evidenced by the sum of the multiplied range oscillator signal frequency and the frequency of the signal generator. Such multiplied inversion oscillator signals, being of high frequency magnitudes would not be within the capabilities of the counter.

Accordingly the counter time gate is extended according to the multiplication factor during a time duration in which the counter is caused to accumulate or respond to the unmultiplied oscillator frequency. In this manner the counter is caused to respond to the original unmultiplied oscillator frequency signal within the counter capability; while the time base into the counter is changed according to the frequency multiplication factor, as needed to extend the effective range of the signal generator.

The display and decoding circuitry operating from the output of the counter then reads all frequencies within the extended frequency range directly.

These and other objects of the present invention together with a complete description thereof, will be described in detail with reference to the following specification and drawings in which.

Figure 1:
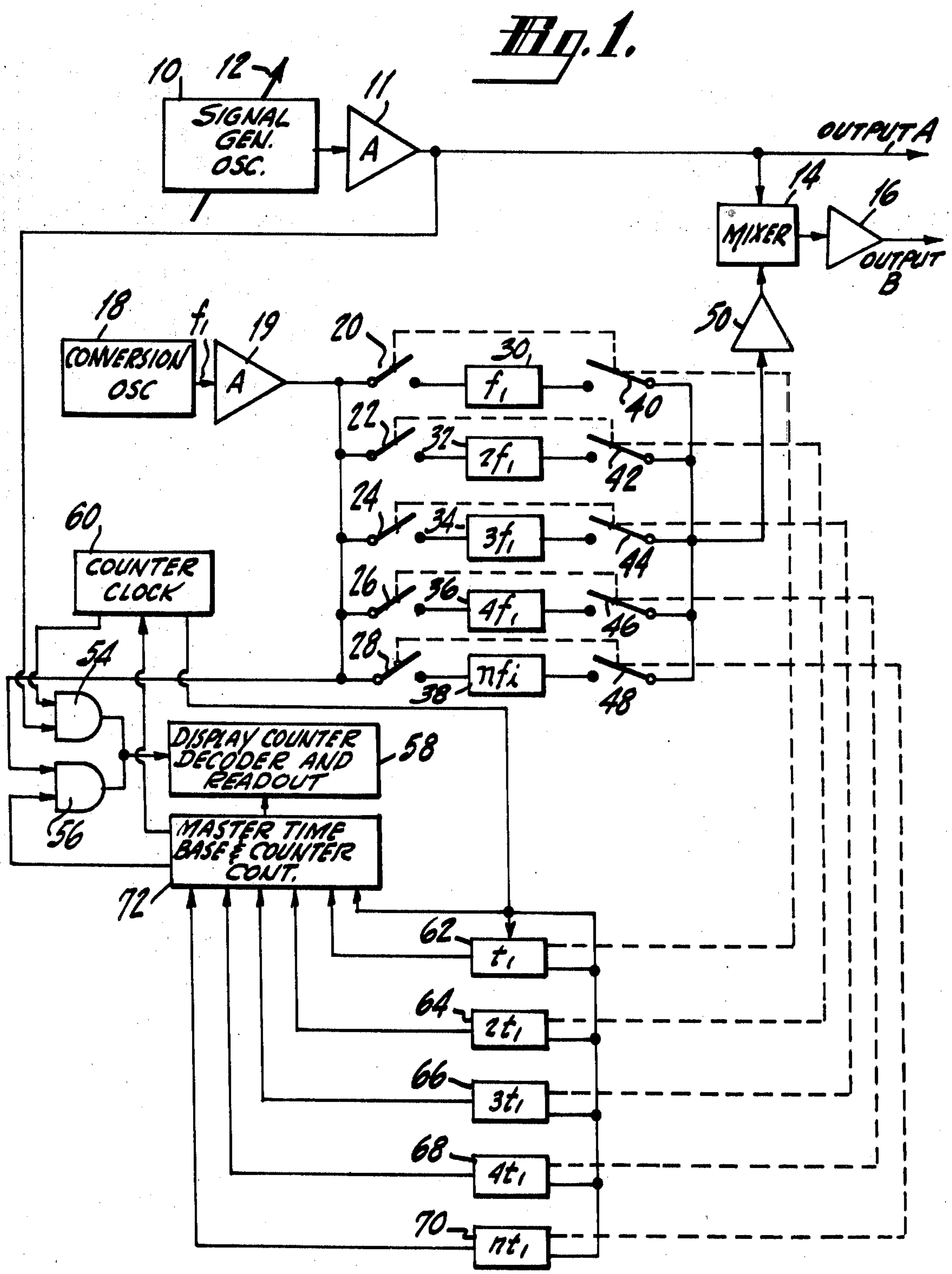
FIG. 1 is a schematic diagram in block form of a signal generator employing a range extension apparatus and display according to this invention.

Referring to FIG. 1 a wideband signal generator or oscillator 10 has an output coupled to the input of an isolation amplifier 11. The signal generator 10 may be a capacitatively tuned variable frequency oscillator or an inductively tuned type. Examples of wide range tuneable oscillators may be had by reference to a text entitled "Vacuum Tube Oscillators" by William A. Edson (1953), John Wiley and Sons.

Oscillator 10 has the capability of being tuned by a suitable variable reactance mechanism represented by arrow 12 over a desired range of frequencies. The isolation amplifier 11 may be a transistor or other amplifying circuit including a suitable isolating output device as an emitter follower and so on. The output of amplifier 11 is coupled to the input of a mixer circuit 14. The mixer 14 provides an output for two radio frequency voltages fed to the inputs, which output contains the sum and difference frequency components of the two signals. Mixer 14 is preferably a balanced mixer configuration in which a reduction of the injected R.F. voltage is provided. For further advantages of such balanced mixer circuits, together with suitable circuits, see the above reference text, entitled "Single Sideband Principles and Circuits" pages 101 and 106.

The output of mixer 14 is coupled to the input of an isolating amplifier 16, which may be a circuit configuration similar to that used for amplifier 11.

A conversion oscillator 18 has an output coupled to the input of isolation amplifier 19. Oscillator 18 may be an oscillator configuration with relatively good frequency stability such as a Clapp or Hartley type. The output of amplifier 19 is coupled to each input terminal of a plurality of switching devices designated as 20, 22, 24, 26 and 28. The input terminal of each switching device 20 to 28 is coupled to the output terminal of amplifier 19. Each switching device as 22 to 28 has an output terminal coupled to the input of separate frequency multiplier circuits designated respectively as 32, 34, 36 and 38. Switching device 20 has the output terminal coupled to the input of a frequency selective amplifier 30, which functions to amplify the output frequency signal of conversion oscillator 18 directly. Multipliers 32 to 38 function to provide a frequency multiplied output of the oscillator 18 frequency signal, $f_1$. In this manner frequency multiplier 32 provides at the output thereof a frequency signal equal to twice the oscillator 18 signal frequency of $2f_1$. Multiplier 34 provides $3f_1$, multiplier 36, $4f_1$, and multiplier 38, $nf_1$.

Such multipliers 32 to 38 are narrow band devices as operation is dependent on known multiples of the input frequency $f_1$, and hence such multipliers contain suitable filtering circuitry of narrow band width. For examples of suitable frequency multiplying circuit configurations, see a text entitled "Waveforms" by Chance et al., McGraw-Hill MIT Radiation Series, volume 19, p. 545. There are many other examples of suitable frequency multiplier circuits known in the art which can be utilized for multipliers 32 to 38.

The output terminal of the amplifier 30 is coupled to the input terminal of a switching device 40. The outputs of the multipliers 32 to 38 are also individually connected to the input terminal of separate switches 42, 44, 46 and 48, respectively. The output terminals of switches 40 to 48 are connected together and coupled to the input of an isolating amplifier 50, whose output is coupled to the other input of the mixer 14. In this manner mixer 14 receives at the two inputs thereof two R.F. signals. One signal is from signal generator 10 and one from the output of amplifier 50. The individual switches 20 to 28 are ganged to those switches 40 to 48, at the outputs of the amplifier 30 and multipliers 32 to 38. Ganged switches result in the closing of switch 40 for the closing of switch 20, the closing of switch 42 for the closing of switch 22 and so on. The output of amplifier 11, is also coupled to the input of a gate circuit 54. The output of isolating amplifier 19, serving to isolate the output of the conversion oscillator 18, is coupled to the input of a gate circuit 56.

The outputs of gates 54 and 56 are coupled to a rectangle 58 referenced as display, counter, decode and readout, Rectangle 58 contains a suitable frequency counter comprising a number of stages of cascaded multivibrators in a counting configuration. Examples of such counters are shown in the text entitled "Pulse and Digital Circuits" by Millman and Taub (1956), McGraw-Hill, chapter 11, entitled "Counting Circuits." Rectangle 58 also includes suitable decoding gates coupled to the outputs of the counter stages to decode the various states thereof. Such decode gates are used to activate a suitable display device included in rectangle 58, to provide the operator of the signal generator with a visual readout of the frequency as will be described. The counting, decode and display circuitry, within rectangle 58 is controlled by suitable timing circuits to enable the counter and associated circuitry 58 to respond to and store data representative of the frequency of the signals applied to the input thereof.

Accordingly a counter clock 60 is shown. Counter clock 60 may include a stable reference oscillator as a crystal controlled, temperature compensated oscillator circuit and serves to generate an accurate time base reference signal. The counter clock module 60 may contain suitable dividing circuitry for developing a requisite output useful for counting frequency. One output of the counter clock 60 is coupled to an input of gate 54. Another output of counter clock 60 is coupled to the inputs of time base generators 62, 64, 66, 68 and 70. Such time base generators may be bistable flip-flop devices for dividing the primary counter clock 60 output by suitable division factors. The selection of a time base generator 62 to 70 is afforded by contacts or detents associated with the above described switches 20 to 28 and 40 to 48, as will be explained. Each time base generator 62 to 70 has an output coupled to a master time base generator and counter control circuit 72. An output of the master control 72 is coupled to an input of gate 56, while a second output of master control 72 is coupled to an input of the display counter, decode, readout module 58.

The master counter control 72 serves to shape and couple the selected outputs of the time base generators 62 through 70 to module 58. The master control 70 further provides gating and enabling waveshapes for the display counter, decode and readout module 58.

The operation of the apparatus shown in FIG. 1 will now be described. Assume that the range of the signal generator oscillator 10 is from 1 to 90 mHz. This indicates that oscillator 10 as built or fabricated is tuneable by control 12 over the above range of 1 to 90 mHz. Now assume that it is desired to provide oscillations or frequencies at the output B, of amplifier 16 over the range of 101 to 190 mHz.

For this example the conversion oscillator 18 is designed to oscillate at a fixed frequency of approximately 100 mHz.

The operator, to extend the range from 1 to 90 mHz. to 101 to 190 mHz., closes switch 20, which in turn closes switch 40 and enables the time base generator 62 labelled $t_1$. In this manner the output frequency of conversion oscillator 18 is applied through amplifier 30 to the input of the mixer 14, which therefore has one input at 100 mHz. Assume now, that signal generator 10 is tuned to provide at the output a frequency signal of 50 mHz. It will also be seen that for all switches 20 to 28 opened, the display counter and decode module 58 will read this frequency (i.e. 50 mHz.) directly, as that frequency signal also obtainable at output A.

With switches 20 and 40 closed the mixer 14 receives the 50 mHz. frequency signal at one input and the 100 mHz. conversion oscillator frequency signal at the other input. A sideband of 150 mHz. is provided and filtered by a bandpass filter included in mixer 14, or made part of amplifier 16, to provide at output B a frequency signal of 150 mHz.

The counter, decode module 58 is activated as follows. Gate 54 receives the 50 mHz. signal and is enabled to conduct by the clock signal generated by counter clock 60. For purposes of this example, this gating clock signal at the input to gate 54 is of a one second duration. Thus gate 54 couples 50,000,000 pulses to the counter circuitry in module 58 during the one second clock period. Hence the counter stores a count representative of the 50,000,000 pulses at the end of the first one second period. The clock signal transition from clock 60, is detected by time base generator 62 ($t_1$), which is the only one activated because of the above switch selection. Generator 62 primes the master control 72 with, in this example, the one second clock. Counter clock and master control 72 then enables gate 56, which applies 100,000,000 pulses to the counter in module 58 during the next second. At the end of this interval the counter display and decode gates are activated by master control 72, and the display reads 150,000,000 Hz. or 150 mHz. This 150 mHz. rate is a relatively high frequency and as such may be one which many ordinary available counters would not be capable of responding to.

The reading thus obtained was afforded by accumulating the 50 mHz. count, and counting from 50 mHz., the number of pulses from the conversion oscillator 18, or 100,000,000 additional pulses. The master control 72 inactivates the clock 60 and gate 56, at the end of this two second interval to permit the stored information in counter module 58 to be displayed.

It is noted that the highest rate that the counter circuit, included in module 58, had to respond to, was the 100 mHz. signal rate from oscillator 18. Such counters are easily implemented and are known in the present state of art to respond to such rates of frequency. The use of a one second counter clock rate for clock 60 is by way of example as there are known techniques for reducing the clock gating rate time while still obtaining frequency readings directly. However, the counter as in module 58, irrespective of the gating rate, still must be capable of responding to the input frequency or the associated signal transitions to count properly.

Now assume a range extension of 301 to 390 mHz. is desired. This means that the frequency range of the signal generator 10 (1 to 90 mHz.) must be up-converted by 300 mHz. The frequency of 300 mHz. is beyond most counting circuitry capabilities and such conventional counters will not respond to these rates. To obtain the 300 mHz. range extension the operator now closes switch 24 which in turn connects multiplier 34 between the output of amplifier 19 and the input to amplifier 50. The frequency multiplier 34 serves to multiply the fixed 100 mHz. oscillator 18 signal by three, to obtain a 300 mHz. signal at its output. This signal is applied to the input of amplifier 50 and hence to the input of mixer 14. Assume the signal generator frequency is again set at 50 mHz. The mixer 14 then provides the upper sideband of 350 mHz. suitably filtered.

The counter display operation is as follows. Gate 54 couples the 50 mHz. generator frequency signal to the counter in module 58, which again counts under control of the 1 Hz. counter clock to 50 mHz. The time base generator 68 serves to divide the 1 Hz. clock 60 signal by three, to provide a three second gate to the counter control 72. The counter control activates gate 56 for the three second period, whereby 100 mHz. transitions are applied to the counter module 58 for three seconds. This three second period causes the counter, in module 58, to read 300 mHz. or 3×100 mHz. This count of 300 mHz. is again accumulated with the original 50 mHz. from the signal generator. Therefore when Master Control 72 activates the display, a reading of 350 mHz. is provided. This reading serves to inform the operator of the exact frequency at output B, without his resorting to mathematical manupulations, dial interpolation or other external equipment.

The table below assumes a signal generator 10 capable of being tuned from 1 to 90 mHz. with an inversion oscillator 18 operating at 100 mHz.

TABLE 1.—(EXAMPLES OF RANGE EXTENSION)

Range of signal generator —1 to 90 mHz.
Counter clock gate—(1 second=$t_i$)

[$fc$=100 mHz.=frequency of conversion oscillator]

| Switches closed | Time generator selected | Input clock to 56 | Range extension, mHz. | Maximum counting rate of counter module 58, mHz. |
|---|---|---|---|---|
| 20 and 40 | 62 ($t_i$) | $t_i$=1 sec. | 101–190 | 100 |
| 22 and 42 | 64 ($2t_i$) | $2t_i$=2 sec. | 201–290 | 100 |
| 24 and 44 | 66 ($3t_i$) | $3t_i$=3 sec. | 301–390 | 100 |
| 26 and 46 | 68 ($4t_i$) | $4t_i$=4 sec. | 401–490 | 100 |
| 28 and 48 | 70 ($nt_i$) | $nt_i$=$n$ sec. | ($1+nfc$-$90+nfc$) | 100 |

As indicated if all switches were opened the counter module 58 would only receive pulses via gate 54 and hence count the range of 1 to 90 mHz. or the primary range of the signal generator 10 directly.

This feature, of course, eliminates any confusion on the part of the operator as to the accuracy of the setting of the signal generator oscillator 10.

Figures 2, 3:
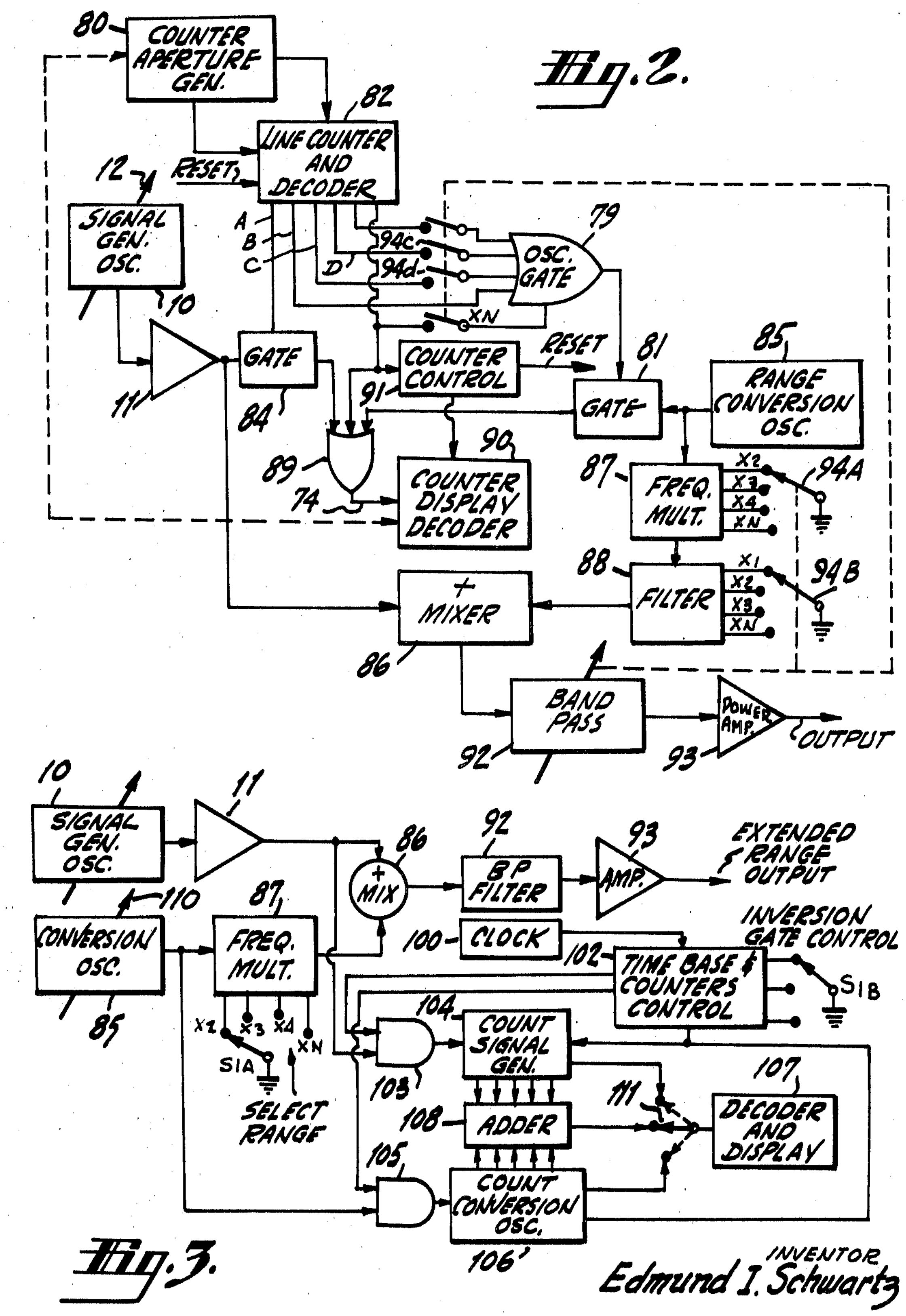
FIG. 2 is a schematic diagram partially in block form of an alternate embodiment according to this invention.
FIG. 3 is a schematic diagram of still another alternate embodiment.

Referring to FIG. 2 the signal generator oscillator 10 and power amplifier 11 are again shown. The output of amplifier 11 is coupled to one input of a gate circuit 84 and to the input of a up-converting mixer 86. The range conversion oscillator 85 (analogous to 18 of FIG. 1) is coupled to the input of a gate 81, and to the input of a frequency multiplying module 87. The outputs of gates 81 and 84 are coupled to the input of an "OR" gate 89, whose output is coupled to the input of a counter, decode and display module 90.

FIG. 2 shows the universality of the approach to be described herein. The counter display and decode module 90 is associated with a counter aperture generator 80. The aperture generator 80 serves to gate the counter to count frequency or pulse transitions at the input 91 thereof. In this manner the counter module 90 reads and displays frequency directly according to the output signal duration of the counter aperture generator 80. The output of the counter aperture generator 80 is coupled to the input of a second counter 82 indicated as line counter and decoder. Outputs of counter 82 are coupled through switches to an "oscillator" gate or "OR" gate 79; whose output is coupled to an input of the gate 84. The counter 82 operates on the output signal of the aperture generator 80 as follows. Counter 82 is an $n$-stage ring counter or a flip-flop counter with decode gates. It therefore provides at each output, a pulse equal in width to the aperture generator pulse, but appearing in sequence. For example, counter 81 provides on lead A a pulse corresponding in width and substantially in phase with the aperture pulse. Lead B has a pulse equal in width to the aperture pulse but appearing after the pulse on lead A terminates. Lead C has a pulse equal in width to the aperture pulse width but appearing after the pulse on lead B ends. This sequence continues for $n$ times, and can be made to repeat or recycle. For a further explanation, if as before, the aperture pulse was 1 Hz. or 1 second in duration, the duration of the line pulses A, B, C etc., would be 1 second but would appear sequentially. Such a circuit 82 is sometimes referred to as a stepping or scanning generator.

Assume that the range of signal generator 10 is from 1–90 mHz. and it is desired to shift the range to 301–390 mHz. Assume again that the operating frequency of the range conversion oscillator 85 is 100 mHz. The operator sets switch 94A to the $x3$ position, which causes the frequency multiplier 87 to multiply the 100 mHz. output from the range conversion oscillator 85 by the factor of three. The 300 mHz. output of the multiplier 87 is filtered by filter 88, to remove unwanted distortion caused by the multiplication process and is applied therefrom, to the appropriate input of the mixer 86. The other input to mixer 86 is from the amplifier 11 coupled to the signal generator 10. If the signal generator was set at 50 mHz. the mixer would then provide the sum and difference frequencies at the output. The difference frequencies and spurious components are removed by the bandpass filter 92. Accordingly the sum frequency signal of (300+50 mHz.) or 350 mHz. appears at the output of power amplifier 93.

The display will provide this reading as follows. The output of signal generator oscillator 10 is applied to one input of gate 84. Gate 84 is of an "AND" type and will provide an output for an enable from the line counter 82. Line counter 82 enables gate 84 for the aperture width, which, for this example, is one second. Therefore, as before, 50,000,000 pulses enter "OR" gate 89 and therefore the counter contained in module 90. When the $x3$ factor was selected via switch 94A, the switches referenced as 94C and 94D are closed. Oscillator "OR" gate 79 has the next sequential line output (B) coupled directly thereto. Line pulses C and D are also applied to the inputs of the oscillator gate 79 via the switches 94C and 94D. In this manner after the counter, in module 90, has counter 50 mHz., gate 79 is enabled by the line B pulse, for 1 second. This allow the counter to accumulate the 100 mHz. count due to the frequency or the conversion oscillator 85, and as applied to counter 90 via "AND" gate 81 and "OR" gate 89. The counter therefore, after line pulse B, has the count corresponding to 150 mHz. stored therein. Switch 90D then allow another 1 second period to enable gate 79 and gate 81 adding and accumulating another 100 mHz. count. Switch 94C enables the gates 81 and 89 for a third aperture time adding still another 100 mHz. count. At the end of the third period the counter control 91 enables the decode and display devices in module 90 and inhibits further counting while resetting the line counter 82. The display then reads 350 mHz.

As before the counter in module 90 never had to respond to a greater input rate than 100 mHz., and therefore was still able to accurately display and store the count corresponding to a frequency of 350 mHz.

In a similar manner, for a multiplication of $n$ times the oscillator 85 frequency, the line counter would enable the oscillator gate 79 and therefore gate 81, $n$ times.

Referring to FIG. 3 the frequency range conversion is accomplished in a similar manner by the mixer 86, and frequency multiplier 87.

In FIG. 3 separate counters 104 and 106 are used with gates 103 and 105 to count the outputs of the conversion oscillator 85 and the signal generator 10 directly.

The counter are controlled by the clock 100 and the time base and counter control 102. In the circuit of FIG. 3 when the multiplication factor is selected for the frequency multipliers 87, to extend the range of the signal generator 10, a proper length clock is automatically routed to the gate controlling the conversion oscillator counter 106. Gate 103 is enabled by a 1 second pulse to cause counter 104 to count the signal frequency directly. Gate 105 counts the conversion oscillator 85 frequency according to the integer of the multiplier. For a setting of a multiplication factor of three times, the gate 105 is enabled for three seconds to cause counter 106 to count the conversion oscillator frequency three times.

At the end of the gating interval as applied to gate 105, the contents of both counters 104 and 106 are gated to binary adding circuits. Such circuits add the binary contents of each counter stage to form a sum equal to the sum of the contents of each counter. For examples of such circuits see a text entitled "Arithmetic Operations in Digital Computers" by R. K. Richards (1955), D. Van Nostrand & Co., chapter 4, "Binary Addition and Subtraction.

The output of the adder 108 is coupled to the display and decode circuitry 107 which provides the operator with a visual readout of the sum. A switch 110 allows the operator to view the contents of either the conversion oscillator counter 106, the signal generator counter 110 or, as above described, the sum of the contents of both.

FIG. 3 also shows a tuning control 110 associated with the conversion oscillator 85. As can be seen from the above description the frequency stability of the conversion oscillator, for such a system, is not as critical as that required in the prior art. Siice the operator has the visual display he can obtain the desired frequency in the extended range of changing the tuning of oscillator 85 and thereby, the output frequency. In this manner if the oscillator frequency drifted 10 mHz. the operator could adjust the frequency of the signal 10 by 10 mHz. or tune the conversion oscillator 85 the requisite amount.

This is possible as a visual display of each frequency may be provided, as in FIG. 3. The sum of both frequencies, one of which is the signal generator frequency is also known or can be determined easily by use of the display and circuitry shown in FIGS. 1 and 2. As indicated, the apparatus depicted in FIGS. 1 and 2 read the signal generator frequency directly when a conversion mode is not selected.

It is understood that other implementations and embodiments of the above described invention will become apparent to one skilled in the state of the art, and as such are to be considered part of this invention, the breadth and scope of which is hereby defined in the appended claims.

What is claimed is:

1. A signal frequency generator capable of being tuned over a relatively wide range of frequencies, in combination therewith apparatus for extending and indicating the effective range of said signal generator, comprising:

(a) counting means capable of providing and storing therein a code manifesting the frequency of a signal applied to an input thereof, said counting means comprising a plurality of active circuits each having a given frequency response, (b) a conversion oscillator for providing a relatively fixed frequency signal output of a frequency magnitude within said given frequency response, (c) first means coupled to said conversion oscillator and said signal generator for providing at an output thereof, a frequency signal having a frequency magnitude substantially equal to the sum of the frequency magnitude of said generator signal and said oscillator signal, said sum frequency being of a greater magnitude than any frequency within said given frequency response, (d) selectively operated means for applying in a first mode said generated output signal to said counting means input for a first predetermined period to cause said counting means to provide and store therein a code manifesting the frequency of said signal generator, and for applying said counting means in a second mode said relatively fixed frequency output signal of said conversion oscillator for a second predetermined period to cause said counting means to accumulate an additional code manifesting the sum of the frequencies of said signal generator and said conversion oscillator, said sum as represented by said code corresponding to the frequency of the signal output of said first means, (e) means compled to said counting means responsive to the termination of said first and second periods for providing an indication of said sum frequency.

2. In combination:

(a) a signal generator for providing at an output thereof any one of a relatively wide range of signal frequencies, (b) a conversion oscillator for providing at an output thereof a relatively fixed frequency signal, (c) converting means coupled to said output of said conversion oscillator and said signal generator for providing at an output thereof a signal having a frequency substantially equal to the sum of said any one signal frequency and said relatively fixed frequency, (d) a counter, for providing and storing a code therein manifesting the frequency of a signal applied to an input thereof, said counter having a frequency response enabling said counter to respond to said fixed frequency signal and to any one of said relatively wide range of signal frequencies, said counter response being such that it cannot conveniently respond to said sum frequency provided by said converting means, (e) means for selectively coupling said input of said counter to said output of said signal generator for a first predetermined period to cause said counter to store a first code therein manifesting said any one signal frequency and for coupling said input of said counter to said output of said conversion oscillator for a second predetermined period for accumulating a second code with said first code manifesting said sum frequency of said output signal at said converting means.

3. In combination with a signal generator capable of being tuned to any frequency signal within a relatively wide range of frequency signals, apparatus for extending and indicating said range of frequency signals comprising:

(a) counting means for providing at an output thereof, when enabled, a code manifesting the frequency of a signal applied to an input, said counting means having a maximum response limited to a given range of signal frequency inputs, (b) a conversion oscillator for providing at an output, a signal having a relatively fixed frequency, said frequency being within said given range of frequency signal inputs, (c) a frequency multiplier coupled to said conversion oscillator for providing an output signal having a frequency equal to a given integral multiple of said relatively fixed frequency, (d) mixing circuit means coupled to said signal generator and said frequency multiplier for providing a signal having a frequency substantially equal to the sum of said any signal frequency, and said frequency equal to a given integral multiple of said fixed frequency, said sum frequency being substantially greater than any frequency included in said given range, (e) means for coupling said signal generator to said counting means for a first predetermined period to enable said counter to provide a first code manifesting the frequency of said any signal frequency, and for coupling said counting means to said conversion oscillator for a period equal to said integral multiple of the first predetermnied period to enable said counter to accumulate with said first code a second code manifesting the sum of said any signal frequency and said integral multiple of said relatively fixed frequency, whereby said counting means always receives at said input a signal frequency within said given range.

4. The apparatus according to claim 3 further comprising:

(a) a bandpass filter coupled to the output of said mixing circuit means for selectively filtering said sum frequency.

5. The apparatus according to claim 3 further comprising:

(a) filtering means coupled between said frequency multiplier and said mixing circuit for substantially reducing any distortion generated by said multiplier during said integral multiplication operation.

6. In combination with a signal generator capable of being tuned over a given range of frequencies, apparatus for extending and indicating said range, comprising, therewith:

(a) a counting circuit having a specified frequency operating range, capable when enabled of providing a code manifesting the frequency of a signal applied to an input thereof, (b) a source of stable oscillations for providing a relatively fixed frequency signal at an output thereof, (c) a frequency multiplier coupled to said source of stable oscillations for providing a signal at an output thereof having a frequency equal to an integral multiple of said fixed frequency signal, (d) a counter clock aperture generator for providing a gating signal of a predetermined and substantially constant time duration, (e) a line sequential counter coupled to said counter clock aperture generator for providing sequential gating signals each one being of said predetermined and substantially constant time duration, said gating signals appearing in time sequence starting from a first to a last output terminal of said counter, said number of gating signals generated according to said integral multiple of said frequency multiplier, (f) a mixer circuit coupled to said signal generator and said frequency multiplier for providing at an output thereof a signal having a frequency substantially equal to the sum of said frequency of said signal generator and said integral multiple frequency, (g) first gating means coupled between said signal generator and said counting circuit, and responsive to said gating signal to enable said counting circuit to provide a first code manifesting the frequency of said generator signal during said predetermined time duration, (h) second gating means coupled between said conversion oscillator and said counting circuit and responsive to said sequental gating signals for enabling said counting circuit to accumulate a second code with said first code manifesting the sum of said frequency of said signal generator and said integral multiple frequency irrespective of any input frequency response of said counting circuit.

7. The apparatus according to claim 6 further comprising:

(a) display means coupled to said counting circuit for providing a visual indication of said second code manifesting the sum frequency.

8. The apparatus according to claim 6 wherein:

(a) the frequency magnitude of said mixer signal having a frequency substantially equal to the sum of said frequency of said signal generator and said integral multiple frequency is beyond said specified frequency operating range of said counting circuit.

9. The apparatus according to claim 8 wherein:

(a) said relatively fixed frequency signal of said conversion oscillator is of a frequency substantially equal to the highest frequency signal within said specified frequency operating range of said counting circuit.

10. Apparatus for use with a signal generator, capable of being tuned to any frequency signal within a given range of frequency signals, a conversion oscillator operating to provide a relatively fixed frequency signal output, a mixer circuit having a first input coupled to an output of said signal generator and a second input coupled to the output of said conversion oscillator for providing at an output a sum frequency signal, having a frequency equal to the sum of the frequencies of said conversion oscillator and said signal generator in combination therewith comprising:

(a) counting means for providing, when enabled, a code manifesting the frequency of a signal applied to an input thereof, said counting means having circuit parameters limiting the range of frequency signals over which said counting means can respond, (b) timing means, including a stable clock source for providing a plurality of gating signals of predetermined and known durations, (c) first gating means having one input coupled to said signal generator output and another input coupled to said timing means for applying said generator signal to said counting means and to enable said counting means during one of said predetermined duration gating signals for causing said counting means to provide a first code manifesting the frequency of said generator signal, (d) second gating means having one input coupled to said conversion oscillator output and another input coupled to said timing means for applying to said counting means and to enable said counting means during a second different predetermined duration gating signal to provide a second code which when accumulated with said first code manifests said sum frequency, irrespective of the range of frequency signals over which said counting means can respond.

11. Apparatus for use with a signal generator, capable of being tuned to any frequency signal within a given range of frequency signals, a conversion oscillator operating to provide a relatively fixed frequency signal output, a frequency multiplier coupled to said conversion oscillator for multiplying said frequency signal by a factor of $n$ times, where $n$ is equal to a positive integer less than 10, for providing at an output a signal of a frequency equal to $n$ times the frequency of said conversion oscillator, a mixer responsive to said signal generator frequency and said multiplied frequency for providing a sum signal having a frequency equal to the sum of said frequency multiplied signal and said generator signal in combination therewith comprising, (a) a counter for providing, when enabled, a code manifesting the frequency of a signal applied to an input thereof, said counter having circuit parameters limiting the range of frequency signals which may be applied to said input to cause said counter to so provide, (b) timing circuit means, including a stable clock source, for providing a first gating signal of a relatively fixed and predetermined duration and a second gating signal of a duration substantially equal to $n$ times the duration of said first gating signal, where $n$ is equal to said multiplication factor, (c) first gating means coupled between said signal generator and said counter and responsive to said first gating signal to enable said counter for said first duration to provide a first code manifesting the frequency of said generator signal, (d) second gating means coupled between said conversion oscillator and said counter and responsive to said second gating signal to enable said counter to provide a second code which when accumulated with said first code manifests the frequency of said sum signal, which frequency is substantially equal to $n$ times the frequency of said conversion oscillator signal plus said frequency of said generator signal.

References Cited

UNITED STATES PATENTS

| | | | |
|---|---|---|---|
| 2,790,079 | 4/1957 | Dodington | 331—40 |
| 2,951,202 | 8/1960 | Gordon | 324—79(D) |

ALFRED E. SMITH, Primary Examiner

U.S. Cl. X.R.

331—44